(12) United States Patent
Matsumura et al.

(10) Patent No.: US 7,279,723 B2
(45) Date of Patent: Oct. 9, 2007

(54) LED LAMP

(75) Inventors: Kanae Matsumura, Aichi-ken (JP); Hideaki Kato, Aichi-ken (JP); Kiyotaka Teshima, Tokyo-to (JP); Shunsuke Ohtsuka, Tokyo-to (JP)

(73) Assignees: Toyoda Gosei Co., Ltd., Nishikasugai-gun, Aichi-ken (JP); Koha Co., Ltd., Nerima-ku, Tokyo-to (JP)

( * ) Notice: Subject to any disclaimer, the term of this patent is extended or adjusted under 35 U.S.C. 154(b) by 267 days.

(21) Appl. No.: 10/804,212

(22) Filed: Mar. 19, 2004

(65) Prior Publication Data

US 2004/0240203 A1 Dec. 2, 2004

(30) Foreign Application Priority Data

Mar. 20, 2003 (JP) ............................ 2003-078267
Aug. 6, 2003 (JP) ............................ 2003-288294

(51) Int. Cl.
*H01L 29/24* (2006.01)
*H01L 29/18* (2006.01)

(52) U.S. Cl. .................. 257/100; 257/89; 257/81; 257/88; 257/99; 257/E33.056; 313/498; 313/499; 313/500

(58) Field of Classification Search ........ 313/498–500; 257/81, 88, 89, 99, 100, E33.056
See application file for complete search history.

(56) References Cited

U.S. PATENT DOCUMENTS 6,841,931 B2 * 1/2005 Takahashi et al. .......... 313/500

6,856,087 B2 * 2/2005 Lin et al. .................... 313/500

FOREIGN PATENT DOCUMENTS

| JP | 07-235624 | 9/1995 |
| JP | 9-181359 | 11/1997 |
| JP | 2000-244022 | 9/2000 |
| JP | 2003-078267 | 3/2003 |
| JP | 2003-288294 | 10/2003 |

OTHER PUBLICATIONS

Chinese Office Action dated Sep. 1, 2006 with an English translation.
Chinese Office Action dated Feb. 10, 2006, and English translation.
Korean Office Action dated Jan. 10, 2006 with an English translation.

* cited by examiner

*Primary Examiner*—Jerome Jackson
*Assistant Examiner*—Joseph Nguyen
(74) *Attorney, Agent, or Firm*—McGinn IP Law Group, PLLC

(57) ABSTRACT

An LED lamp has a package and a plurality of light emitting elements that are electrically connected to a plurality of electrode plates provided in the package and that are sealed with transparent material. A red light emitting element of the plurality of light emitting elements is wire bonded along the longitudinal direction of the package, a green light emitting element and a blue light emitting element are flip-chip bonded with its electrode faced down, and the electrodes are extended to a surface opposite to the light emission surface of the LED lamp while being embedded in the package.

18 Claims, 12 Drawing Sheets

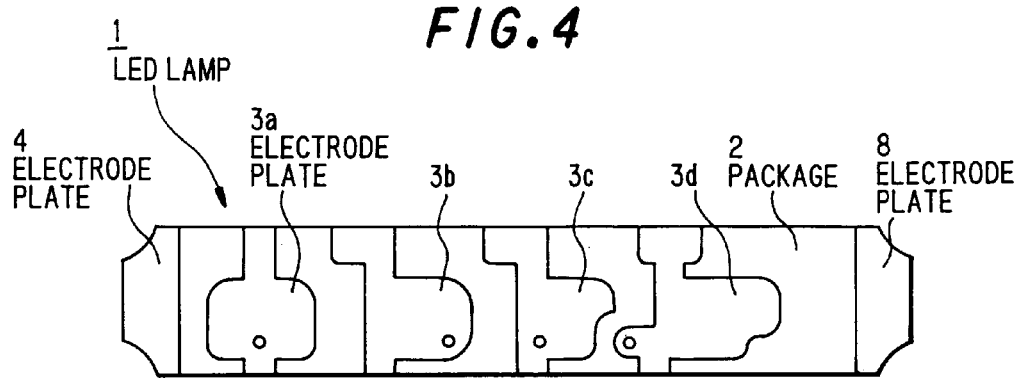
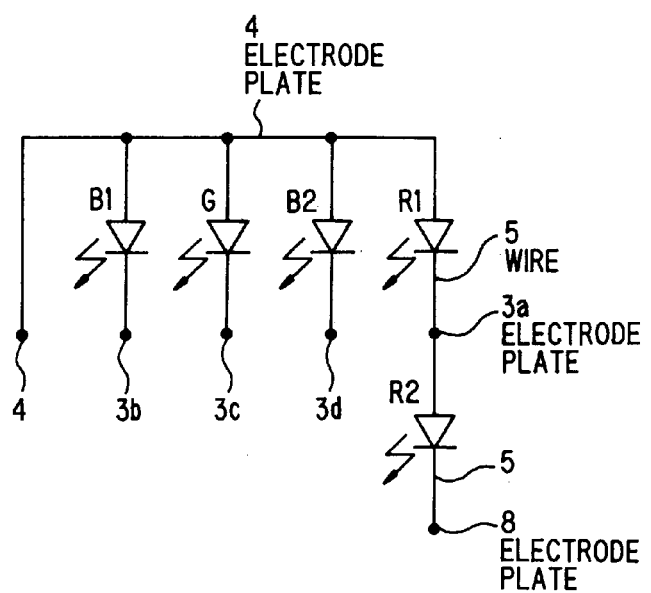

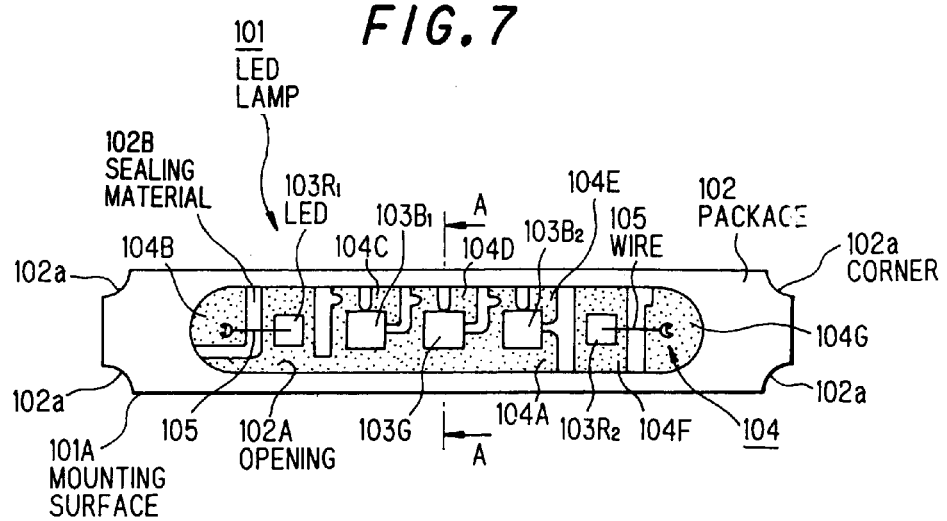
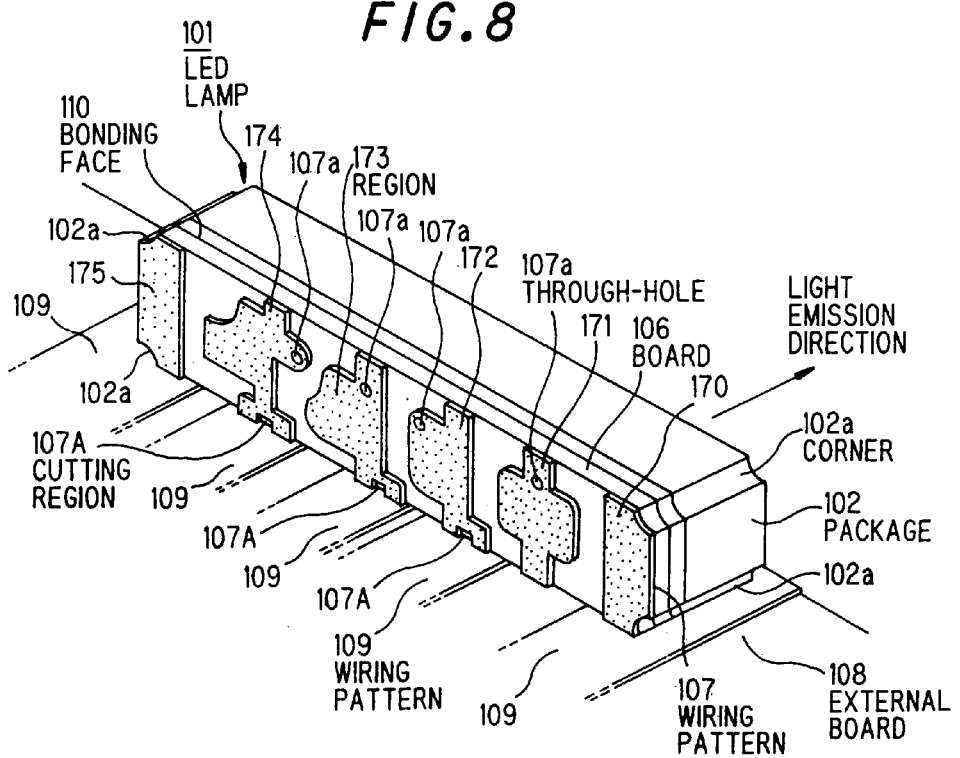

LED LAMP

The present application is based on Japanese patent application Nos. 2003-078267 and 2003-288294, the entire contents of which are incorporated herein by reference.

BACKGROUND OF THE INVENTION

1. Field of the Invention

The invention relates to a light emitting diode lamp (herein referred to as an LED lamp) and, particularly, to an LED lamp that a plurality of light emitting elements, and electrode plates and wires for electrical connection with these light emitting elements are housed in a package of a material such as ceramics and are sealed with transparent epoxy resin.

Also, the invention relates to an LED lamp that is intended to have stable solder connectivity when being connected with a wiring pattern.

Herein, an LED chip itself is referred to as a light emitting element or light emitting diode (LED), and a whole structure with a plurality of LED chips is referred to as a light emitting diode lamp or LED lamp.

2. Description of the Related Art

Conventionally, SMD package type LED lamps are used as backlight light source. The SMD package type LED lamp is composed of: a package of synthetic resin formed by injection molding; a plurality of metal leads formed within the package; a plurality of LED's mounted on one of the leads; wires to offer the electrical connection between the other lead and LED's electrode; and sealing material such as transparent epoxy to seal the entire LED.

FIG. 1A is a plain view showing one example of the conventional SMD package type LED lamp. FIG. 1B is a cross sectional view cut along the line Y-Y in FIG. 1A.

As shown in FIG. 1A, an LED lamp 11 is structured such that the upper half region of an opening 12a in a package 12 of synthetic resin is provided with a single-sheet metal lead 13 extended from its left end to right end while being sandwiched within the package 12. On the lead 13, five LED's, two red LED's R1, R2 and two blue LED's B1, B2 and green LED G, are mounted in a line while having a narrow interval.

On the other hand, the lower half region of opening 12a is provided with a lead protrusion at nearly the center, and five leads 14a, 14b, 14c, 14d and 14e are sandwiched within the package 12 while being separated from the lead 13. These leads 13, 14a, . . . , 14e and the package 12 are integrally formed by disposing the leads 13, 14a, . . . , 14e in an injection mold for package 12 and then conducting the insert molding of package 12.

In the LED lamp 11, the leads 14a, . . . , 14e extended below the package are folded forward or backward along the lower surface of package 12. For example, the leads 14b, 14d are folded forward and the leads 14a, 14c and 14e are folded backward. The folded face is soldered to a mount board 18. Thus, the LED lamp 11 is mounted through solder 17 on the mount board 18.

Recently, an LED lamp to be used as a backlight for LCD of cellular phones having a rapidly increased demand, especially a field sequential type full-color LED lamp is needed to have a height of half or less the current height on the light emission surface side according as cellular phones are need to have a reduced thickness. In the LED lamp 11 as shown in FIG. 1A, where the five LED's are die bonded in the upper half region of light emission surface (opening 12a) and they are wire bonded to the leads 14a, . . . , 14e in the lower half region, it is impossible to further reduce the height on the light emission surface side.

On the other hand, the mounting workability of LED becomes serious according as the LED lamp is downsized. Namely, since the mounting area decreases as LED lamp is downsized, it is difficult to stably secure the electrical connection while securing a sufficient bonding strength.

Japanese patent application laid-open No. 2000-244022 discloses an LED lamp (herein referred to as prior art 1) that a recess to house a bump, solder ball, is provided at its bottom surface so as to enhance the bonding strength while using the bottom face and side face of recess as bonding surface.

FIG. 2 is a cross sectional view showing the LED lamp described in prior art 1. The LED lamp 30 is compose of an insulation board 31 and a thin plate 50 to be bonded through a adhesive film 40 to the insulation board 31.

The insulation board 31 is provided with a through-bore 31A to house an LED chip 32, and the through-bore 31A has first and second plating layers 54a, 54a on its bottom surface. The LED chip 32 is mounted on the first plating layer 54a and the upper-surface electrode of LED chip 32 is electrically connected through a wire 33 to the second plating layer 54a with a different polarity.

The thin plate 50 is formed by covering the lower surface of metal plates 51, 52 with insulative resin 53 while electrically insulating them at insulation part 53A. The thin plate 50 is also provided with a recess 50A to attach a bump 55 in its bottom surface. The recess 50 is covered with plating layers 54b, 54b and the bump 55 is attached therein. In this composition, when the bumps 55 is melted to conduct the solder bonding, the bottom face and side face of recess 50A being covered with the second plating layer 54b serve as a bonding surface. Therefore, the solder bonding property can be enhanced.

However, in the LED lamp disclosed in prior art, since the solder bonding property of LED lamp depends on the shape of solder, it is necessary to keep a constant bump shape to obtain a stable solder bonding property. Therefore, the manufacturing process must be complicated.

SUMMARY OF THE INVENTION

It is an object of the invention to provide an LED lamp that has a significantly reduced height on its light emission surface side.

It is a further object of the invention to provide an LED lamp that a stable solder bonding property can be easily obtained.

(1) According to first aspect of the invention, an LED lamp comprises:

a package; and a plurality of light emitting elements that are electrically connected to a plurality of electrode plates provided in the package and that are sealed with transparent material;

wherein a red light emitting element of the plurality of light emitting elements is wire bonded along the longitudinal direction of the package, a green light emitting element and a blue light emitting element are flip-chip bonded with its electrode faced down, and the electrodes are extended to a surface opposite to the light emission surface of the LED lamp while being embedded in the package.

In this composition, the green light emitting element and blue light emitting element are flip-chip bonded through Au bump etc. to the electrode plate without conducting the die bonding while facing down the two-electrode forming surface. The red light emitting element is die bonded while wire bonding its upper electrode. However, the electrode plate is not disposed at the lower half portion of light emission surface as in the conventional LED lamp 11. Namely, in the invention, the electrode plate is disposed along the line on which a plurality of LED's are arrayed in alignment and the wire bonding is conducted along the longitudinal direction of package. Further, the electrode plate is extended to the back side while being embedded in the package and is soldered to be connected to power supply.

Thus, the light emission surface (opening) only has to have such a height that a plurality of LED's can be housed and the electrode plates to connect with the plurality of LED's do not contact each other. As a result, the lower half portion of the conventional LED lamp 11 can be omitted.

Thus, by minimizing the wire bonding and embedding the electrode plate in the package without extending the electrode plate as a lead, the height of package on the light emission surface side can be reduced to less than half of that at the present.

(2) In the LED lamp (1), the red light emitting element may be a plurality of red light emitting elements, and every two of the plurality of red light emitting elements may be connected in series.

The red light emitting element has a standard voltage Vf of about half that of the green light emitting element G and blue light emitting element. Therefore, when the two in-series red light emitting elements are in parallel connected to the green light emitting element and blue light emitting element, a voltage to be applied to each of them can be equal. Therefore, the respective light emitting elements can emit light stably.

Thus, the respective light emitting elements can emit light stably near the standard voltage Vf as well as reducing the height of package on the light emission surface side to less than half of that at the present.

(3) In the LED lamp (1), the package may be of ceramics material with a good thermal conductivity.

The ceramics material with a good thermal conductivity includes aluminum nitride (AlN), alumina ($Al_2O_3$). By using ceramics material with a good thermal conductivity as package material, the heat radiation property can be significantly enhanced as compared with the conventional package 12 of synthetic resin. Thereby, even in continuous operation for long hours, the emission characteristics do not lower.

Thus, the respective light emitting elements can be stably operated for long hours as well as reducing the height of package on the light emission surface side to less than half of that at the present.

(4) According to second aspect of the invention, an LED lamp comprises:

a circuit board with a wiring pattern formed thereon; and a package that houses a light emitting element, the package being mounted on the circuit board;

wherein the package is provided with a terminal that is electrically connected to the wiring pattern by using solder, and part of the terminal and/or the wiring pattern is provided with a cutting region that allows the retention of solder to be flown thereinto.

In this composition, with the cutting region, a suitable amount of solder can be supplied to the connection part of the terminal of package and the wiring pattern of circuit board. Therefore, the enhanced solder bonding property can be obtained easily.

(5) According to third aspect of the invention, a method of making an LED lamp comprises the steps of:

preparing a first thin plate with an opening, a second thin plate with a first wiring pattern formed thereon, and a third thin plate with a second wiring pattern formed thereon;

stacking the first thin plate, the second thin plate and the third thin plate in this order;

baking the stacked first thin plate, the second thin plate and the third thin plate to provide an assembly integrating the first to third thin plates;

mounting an LED in the opening and electrically connecting the first wiring pattern to the LED; and cutting the assembly in a predetermined pattern.

BRIEF DESCRIPTION OF THE DRAWINGS

The preferred embodiments according to the invention will be explained below referring to the drawings, wherein:

FIG. 4 is a bottom view showing the LED lamp 1 in FIG. 3A;

FIG. 5 is a circuit diagram showing the circuit composition of light emitting elements R1, R2, B1, B2 and G;

FIG. 7 is a front view showing an LED lamp 101 in a second preferred embodiment of the invention;

FIG. 8 is a perspective view showing the LED lamp 101 of the second embodiment;

DETAILED DESCRIPTION OF THE PREFERRED EMBODIMENTS

First Embodiment

Figure 1A:
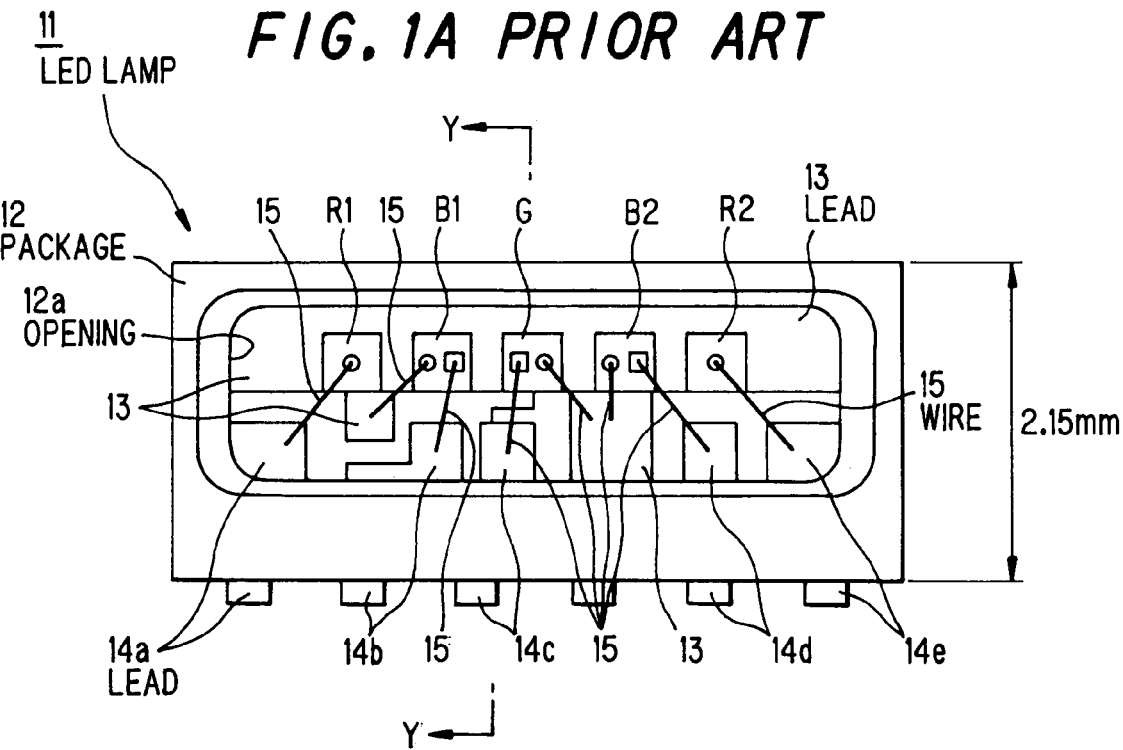
FIG. 1A is a plain view showing one example of the conventional SMD package type LED lamp.
Figure 1B:
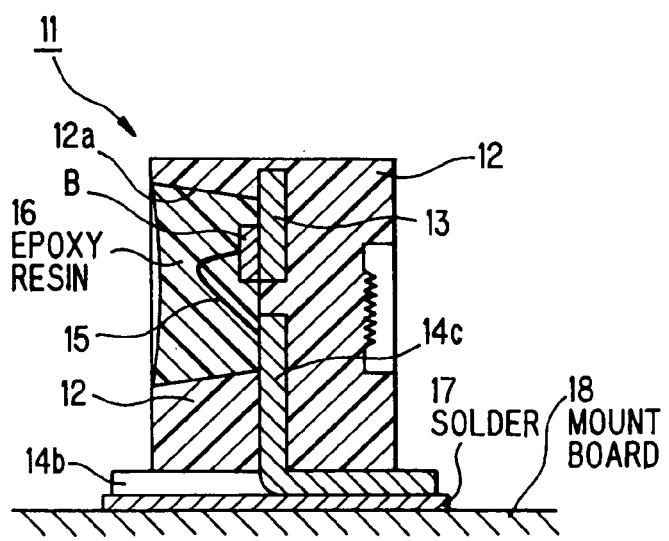
FIG. 1B is a cross sectional view cut along the line Y-Y in FIG. 1A.
Figure 2:
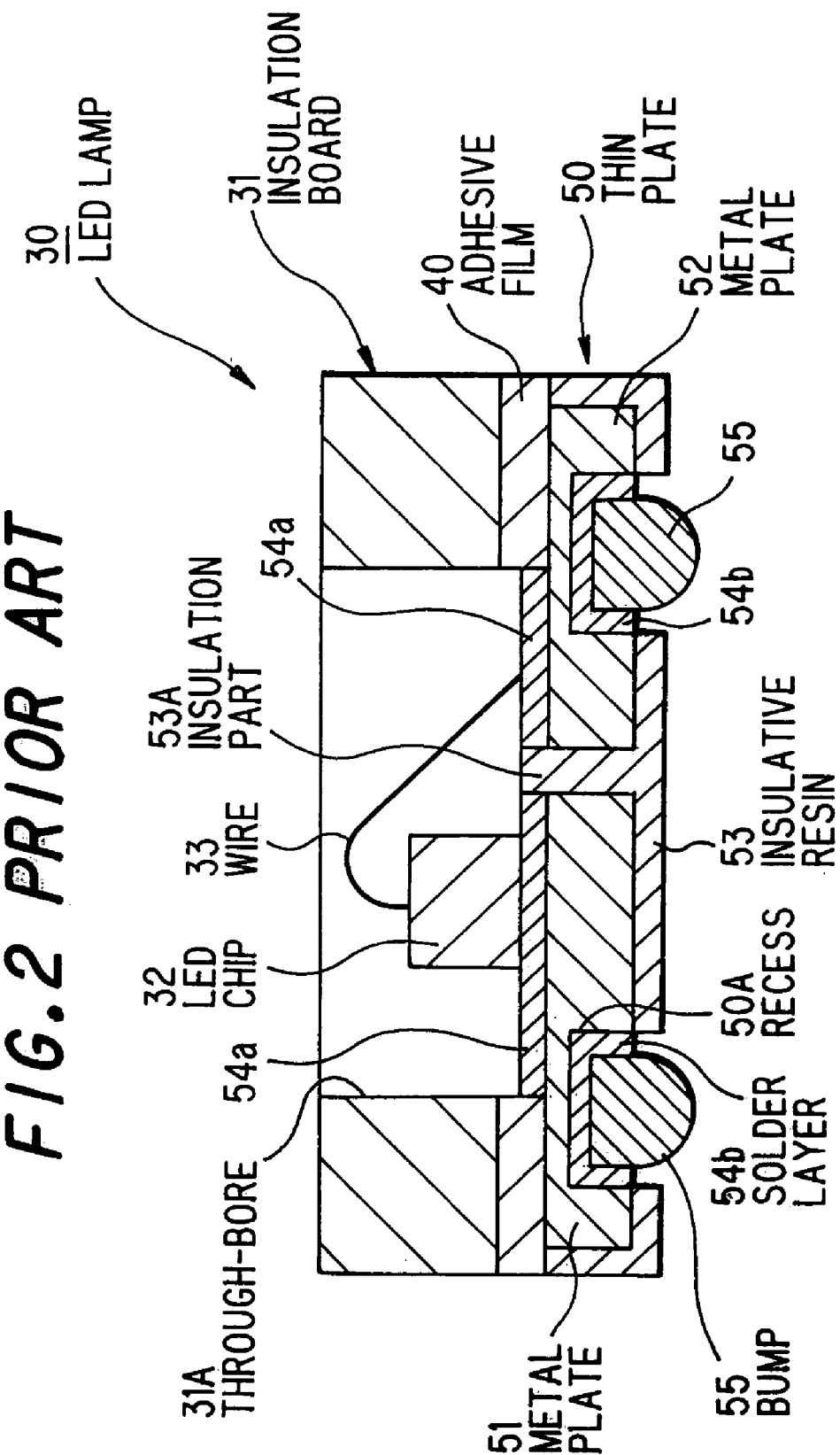
FIG. 2 is a cross sectional view showing an LED lamp described in prior art 1.
Figure 3A:
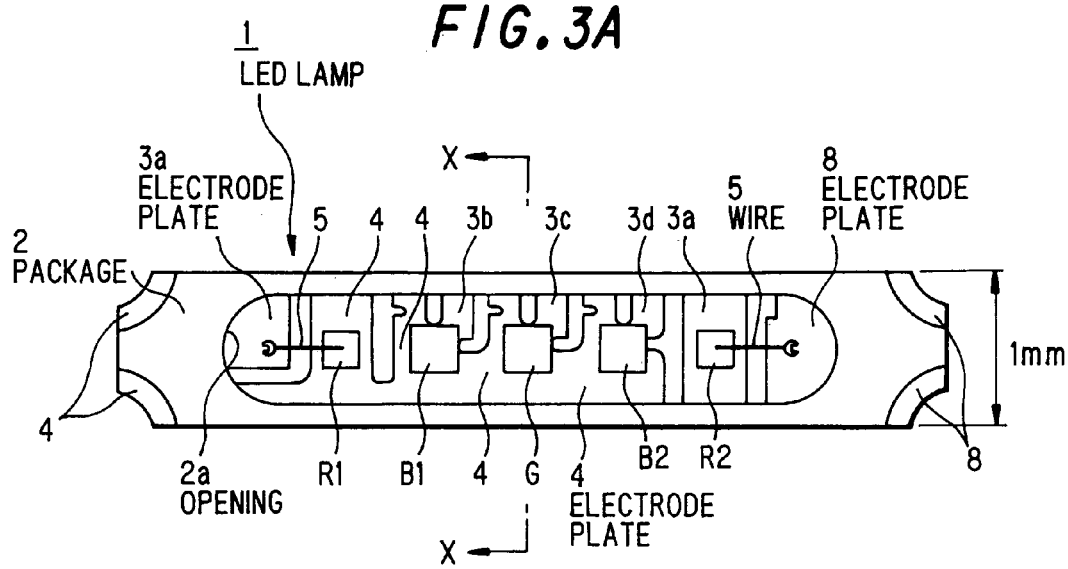
FIG. 3A is a plain view showing an LED lamp 1 in a first embodiment of the invention.
Figure 3B:
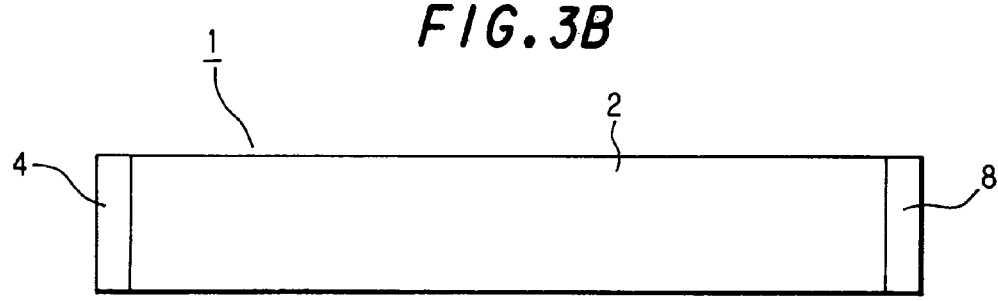
FIG. 3B is a side view showing the LED lamp 1 in FIG. 3A.
Figure 3C:
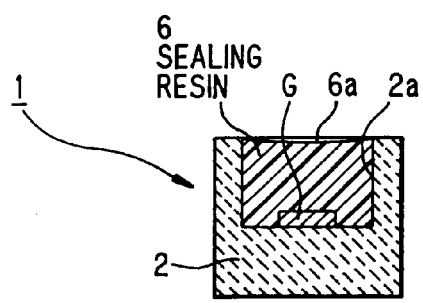
FIG. 3C is a cross sectional view cut along the line X-X in FIG. 3A.

FIG. 3A is a plain view showing an LED lamp 1 in the first embodiment of the invention. FIG. 3B is a side view showing the LED lamp 1 in FIG. 3A. FIG. 3C is a cross sectional view cut along the line X-X in FIG. 3A.

As shown in FIG. 3A, the LED lamp 1 is provided with electrode plates 3*a*, 3*b*, 3*c*, 3*d*, 4 and 8 on the bottom surface of an opening 2*a* in a package 2 of alumina ($Al_2O_3$) that are insulated one another and part of which penetrates to the bottom surface (backsurface) of the package 2. At both ends, red light emitting elements R1, R2 are die bonded on the electrode plates 4, 3*a*. The upper-surface electrode (not shown) of red light emitting element R1 is bonded through a wire 5 to the electrode plate 3*a* at the left end. The upper-surface electrode (not shown) of red light emitting element R2 is bonded through a wire 5 to the electrode plate 8. Further, a conduction line (not shown) penetrates from the left-end electrode plate 3*a* to the right-end electrode plate 3*a* in the package 2. Thereby, the red light emitting elements R1, R2 are connected in series.

The downward electrodes (not shown) of a blue light emitting element B1 are flip-chip connected to the electrode plates 3*b*, 4 through Au (gold) bumps (not shown). The downward electrodes (not shown) of a blue light emitting element B2 are flip-chip connected to the electrode plates 3*d*, 4 through Au bumps (not shown). The downward electrodes (not shown) of a green light emitting element G are flip-chip connected to the electrode plates 3*c*, 4 through Au bumps (not shown).

The alumina package 2 is formed by cutting a through-hole board by using a dicer and is provided with Au plating portions 4, 8, which are each shaped like a quarter circle, on its four corners. The Au plating portions 4, 8 are extended through its side as shown in FIG. 3B to its bottom as shown in FIG. 4.

The opening 2*a* of package 2 is, as shown in FIG. 3C, formed by trenching the package 2 about half its thickness, and the electrode plates 3*a*, 3*b*, 3*c*, 3*d*,4 and 8, light emitting elements R1, R2, B1, B2 and G and two wires 5 are sealed with transparent epoxy resin 6 as a light-transmitting material filled in the opening 2*a*. Although the surface 6*a* of transparent resin 6 is slightly concave due to a contraction in thermal curing, it can be flat in thermal curing if such a contraction is taken into consideration. It is preferable that the surface 6*a* is thus made to be flat since it can be closely contacted to a light-guiding plate when the LED lamp 1 is used as a backlight and, thereby, a reflection loss can be reduced.

FIG. 4 is a bottom view showing the LED lamp 1 in FIG. 3A. As shown, four Au plating patterns for soldering are provided on the bottom surface of LED lamp 1. These Au plating patterns are electrically connected with part of electrode plates 3*a*, 3*b*, 3*c*, 3*d*, 4 and 8 being extended to the bottom of package 2. By electrically connecting the Au plating patterns to a power supply, electric power can be supplied to the light emitting element R1, R2, B and G that are connected with the electrode plates 3*a*, 3*b*, 3*c*, 3*d*, 4 and 8.

FIG. 5 is a circuit diagram showing the circuit composition of light emitting elements R1, R2, B1, B2 and G. As shown, the electrical circuit of LED lamp 1 is an anode-common circuit that the electrode plate 4 is used as an anode terminal. The two red light emitting elements R1, R2 are connected in series. The red light emitting elements R1, R2 have a standard voltage Vf of about half that of the green light emitting element G and blue light emitting elements B1, B2. Therefore, when the two in-series red light emitting elements R1, R2 are in parallel connected to the green light emitting element G and blue light emitting elements B2, a voltage to be applied to each of them can be equal. Therefore, the light emitting elements R1, R2, B1, B2 and G can emit light stably.

Figure 6:
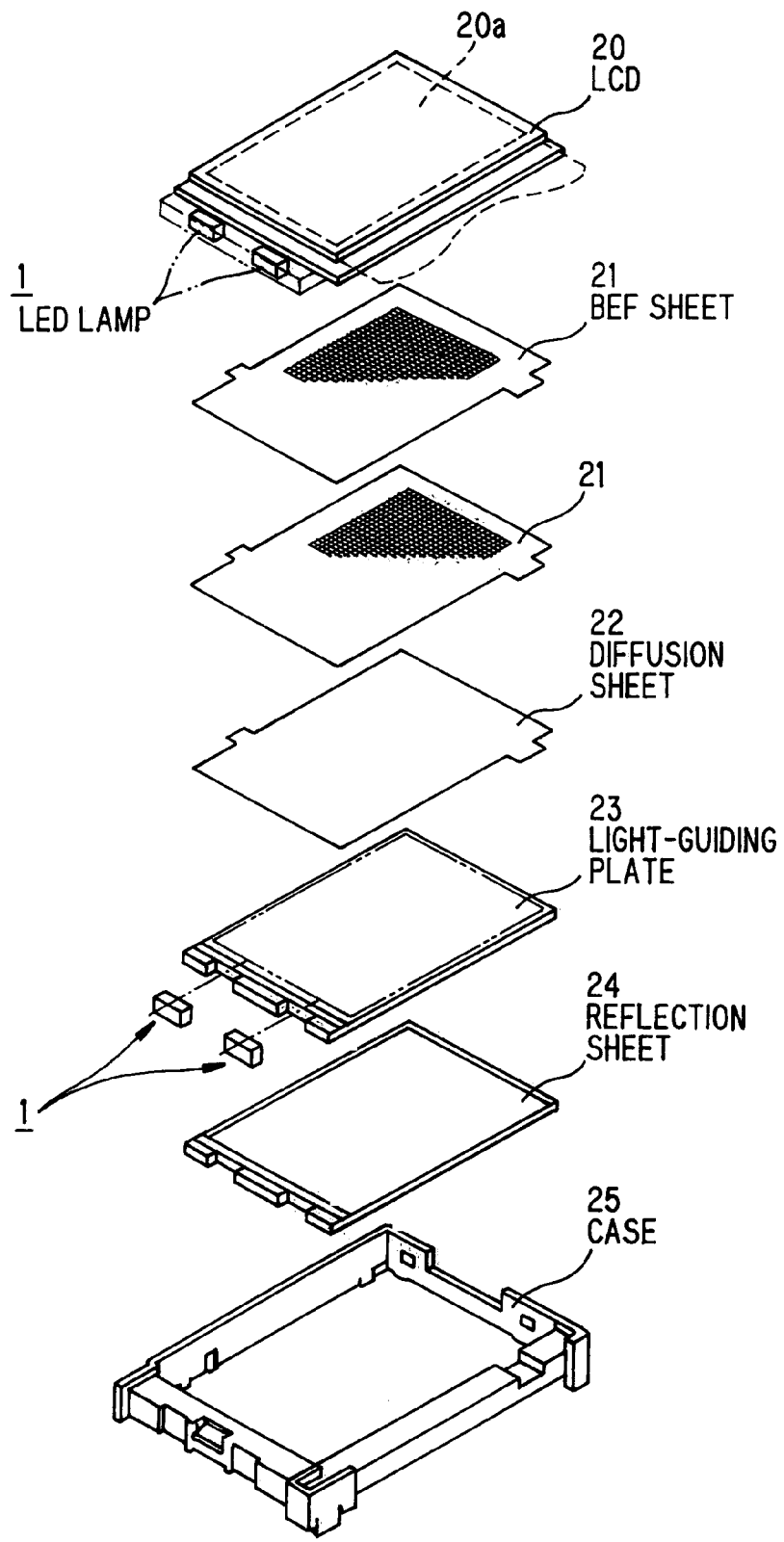
FIG. 6 is an exploded perspective view showing LCD (liquid crystal display) as an application of LED lamp 1 of the first embodiment.

FIG. 6 is an exploded perspective view showing LCD (liquid crystal display) as an application of LED lamp 1 of the first embodiment. As shown, two LED lamps 1 are used and its light emission surfaces are closely attached to the end surface of a light-guiding plate 23. The light emission surface side of LED lamp 1 has a height of about 1 mm, as shown in FIG. 3A, and the light emission surface (opening 2*a*) itself has a height of about 0.7 mm. Therefore, the end face of light-guiding plate 23 also has a thickness of about 0.7 mm. Further, the end of light-guiding plate 23 is provided with a tapered portion to make its main body thin.

A reflection sheet 24 is provided below the light-guiding plate 23. It serves to reflect LED light radiated below the light-guiding plate 23 to converge it to the side of LCD 20. Further, a diffusion sheet 22 is stacked on the light-guiding plate 23 and two BEF sheets 21, 21 are stacked on the diffusion sheet 22. These sheets 21, 22 serve to enhance the evenness of LED light radiated up from the light-guiding plate 23 to increase the brightness of LCD 20.

By housing these plates and sheets in a case 25, they can be precisely aligned and the electrical connection of two LED lamps 1 to an external power supply can be secured.

Thus, the height of light emission surface side is significantly reduced from about 2.15 mm of the conventional LED lamp 11 to about 1 mm, which is less than half the former height. Therefore, the LED lamp 1 can be used as a white backlight for LCD of cellular phone that requires a further reduced thickness or as a field sequential type full-color LED lamp to allow color displaying even in monochrome LCD.

Since the LED lamp 1 of this embodiment uses two blue light emitting elements B1, B2 and one green light emitting element G, bluish white light on the whole can be generated. Further, it can save electricity since the blue light emitting element has emission efficiency better than the green light emitting element. When greenish white light is needed, it may use two green light emitting elements G1, G2 and one blue light emitting element.

Although this embodiment uses red, green and blue LED's corresponding to light's three primary colors to offer a white LED lamp or field sequential type LED lamp, another color light emitting element(s) may be used for an LED lamp having the other use. Further, it may use light emitting elements with four colors or more or may use a plurality of light emitting elements with two colors or one color.

In this embodiment, the package 2 is of alumina ($Al_2O_3$), one of ceramics materials. Alternatively, it may be of the other ceramics such as aluminum nitride (AlN) or various materials other than ceramics.

In this embodiment, transparent epoxy resin is used as a sealing material. Alternatively, transparent silicon resin may be used and any transparent material may be used if satisfying a fluidity before curing, a filling property, a transparency after curing, a strength etc.

Second Embodiment

FIG. 7 is a front view showing an LED lamp 101 in the second preferred embodiment of the invention. The LED lamp 101 is composed of: a package 102 that is formed by stacking thin plate members; LED's 103R1, 103R2, 103G, 103B1 and 103B2 that are housed in an opening 2*a* of the package 102; a wiring pattern 104 that is formed on a board as described later to offer the electrical connection to LED's; a sealing material 102B of transparent epoxy resin to be filled in the opening 102A to protect LED's.

The package 2 is formed by stacking a plurality of thin plate members of ceramics, and LED's 103R1, 103R2, 103G, 103B1 and 103B2 are arrayed in the ellipse-shaped opening 2A to compose the LED lamp. The package 102 is provided with corners 102a that are shaped like an inverted arc.

LED's 103R1, 103R2 each have electrodes on its top and bottom surfaces and the top electrode is electrically connected through a wire 105 to the wiring pattern 104. LED's 103G (green), 103B1 and 103B2 (both blue) have electrodes on its bottom, and the bottom electrodes are electrically connected through Au bump to the wiring pattern 104. Although the LED lamp 101 has red-green-blue LED's, it may have one-color or two-color LED's.

The wiring pattern 104 is formed by laminating Au layer on tungsten layer and is composed of wiring regions 104A, 104B, 104C, 104D, 104E and 104F. In the second embodiment, the wiring region 104A is an anode and the wiring regions 104C, 104D, 104E and 104G are cathodes. The wiring region 104B is electrically connected to the wiring region 104F through a wiring layer (not shown) provided within the board.

FIG. 8 is a perspective view showing the LED lamp 101 of the second embodiment. This perspective view is viewed from the bottom side opposite to the light emission surface of LED lamp 101 mounted on an external board 108. A board 106 with thin ceramics plates laminated is provided on the bottom side of LED lamp 101, and a wiring pattern 107 is provided on the surface of board 106. Meanwhile, FIG. 8 shows a state of before providing the solder bonding between the wiring pattern 107 and a wiring pattern 109 formed on the external board 108.

The wiring pattern 107 is formed by laminating Au layer on the tungsten layer. It has a plurality of regions 170, 171, 172, 173, 174 and 175, and through-holes 107a to offer the electrical connection to the wiring pattern 104 while penetrating through the board 106. The regions 172, 173 and 174 have a rectangular cutting region 107A that is cut off together with the board 106 at the boundary portion to the wiring pattern 109. The region 170 is soldered along the inversed arch-shaped end of a corner 102a.

The external board 108 is composed of a glass epoxy board and the wiring pattern 109 of conductive film formed on the surface of glass epoxy board. In this embodiment, the wiring pattern 109 is of copper foil. The wiring pattern 109 is formed in a direction perpendicular to the wiring pattern 107 of LED lamp 101 and is provided with solder (not shown) on its surface.

Figure 9:
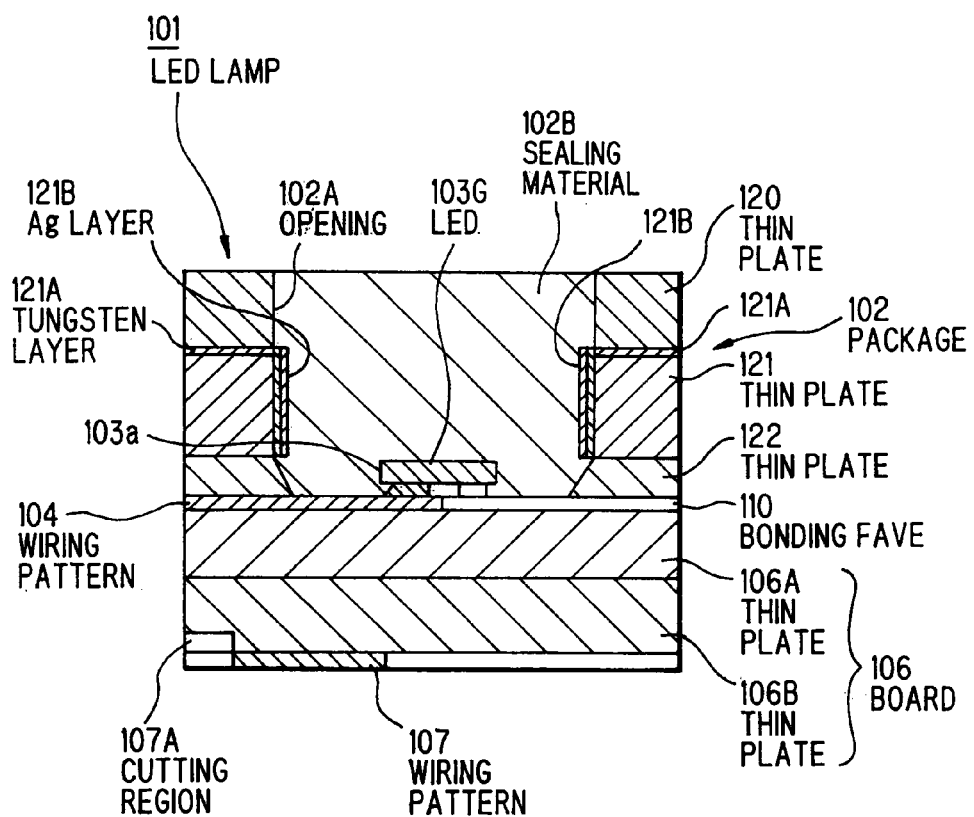
FIG. 9 is a cross sectional view cut along the line A-A in FIG. 7.

FIG. 9 is a cross sectional view cut along the line A-A in FIG. 7. The package 102 is formed by stacking three thin plates, 120, 121 and 122 and is bonded through a bonding face 110 to the board 106.

The thin plate 121 is provided with tungsten layer 121A at the interface to the thin plate 120 and on its exposed face to the opening 102A, and the tungsten layer 121 A on the exposed face is provided with Ag layer 121B to reflect light.

The thin plate 122 is provided with a plane to be inclined in the depth direction of opening 120A.

The board 106 is formed by laminating thin ceramics plates 106A an 106B, and a wiring pattern (not shown) is formed between the thin plates 106A and 106B. The thin plate 106B is provided with the cutting region 107A to be cut off by etching together with the wiring pattern 107.

Figure 10A:
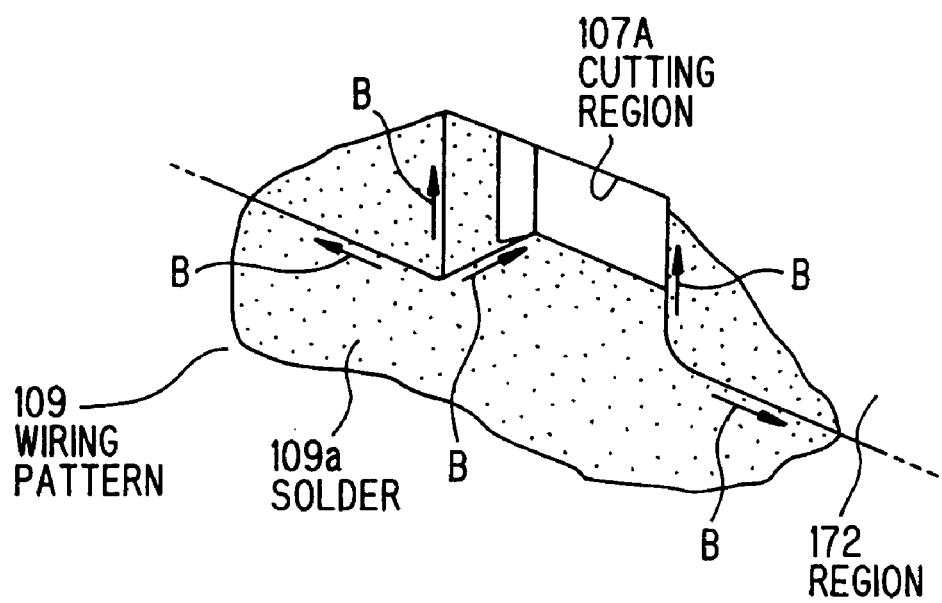
FIG. 10A is an enlarged perspective view showing a state of solder 109*a* flowing into a cutting region 107A in FIG. 8 in reflowing.
Figure 10B:
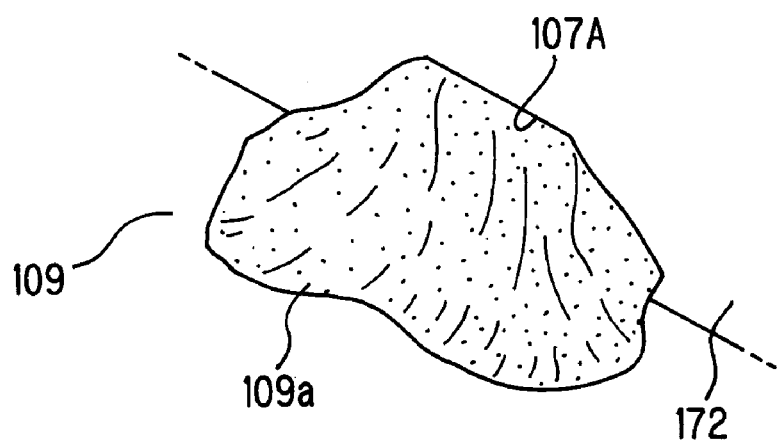
FIG. 10B is an enlarged perspective view showing a state of solder 109*a* hardened in the cutting region 107A.

FIG. 10A is an enlarged perspective view showing a state of solder 109a flowing into the cutting region 107A in FIG. 8 in reflowing. FIG. 10B is an enlarged perspective view showing a state of solder 109a hardened in the cutting region 107A.

As shown in FIG. 10A, when conducting a reflow while disposing the wiring pattern 109 and region 172 orthogonal to each other, solder 109a being melt flows in directions of arrow B based on the capillary action and flows into the cutting region 107A. As shown in FIG. 10B, solder 109a is hardened like a slope between the wiring pattern 109 and region 172 and, thereby, the electrical connection therebetween can be obtained. The solder 109a being melt is protected from further rising by the upper end of cutting region 107A and, thereby, spreading over the region 172 can be prevented.

Figure 11A:
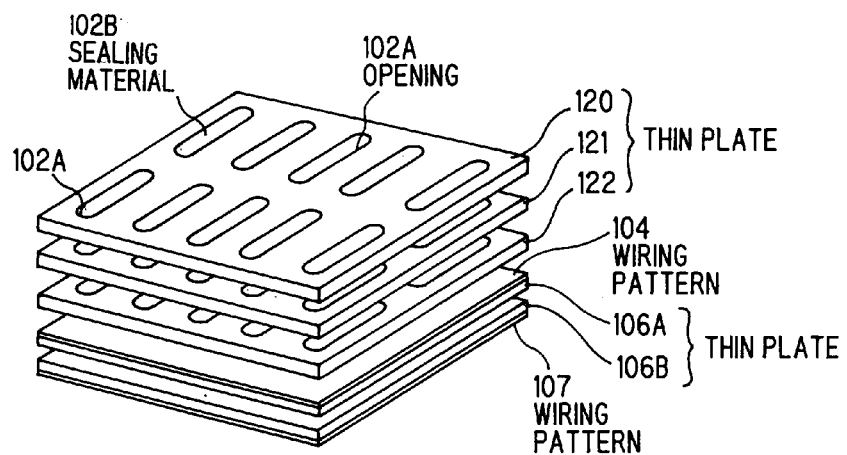
FIGS. 11A to 11C are perspective views showing a method of making the LED lamp 101 of the second embodiment.
Figure 11B:
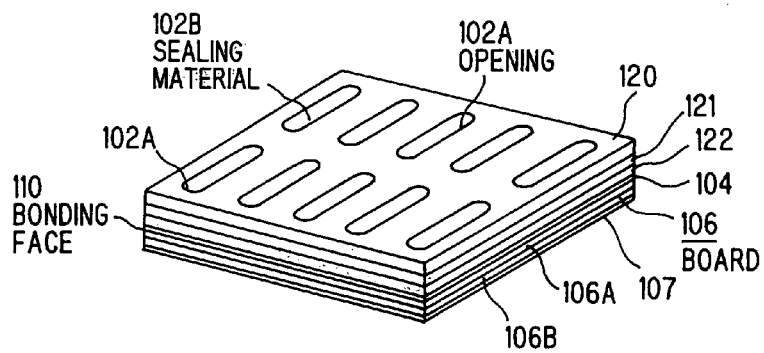
Figure 11C:
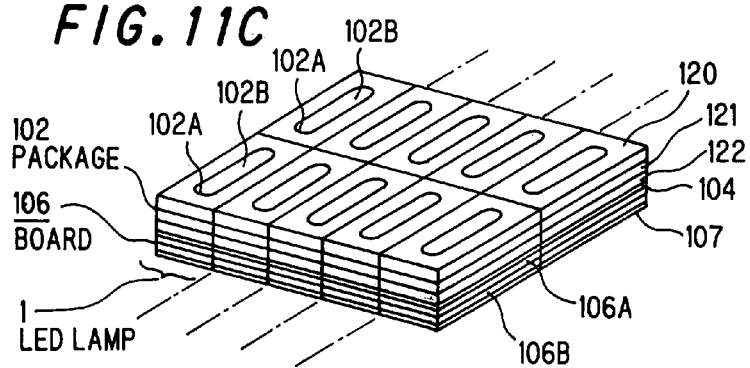
Figure 12:
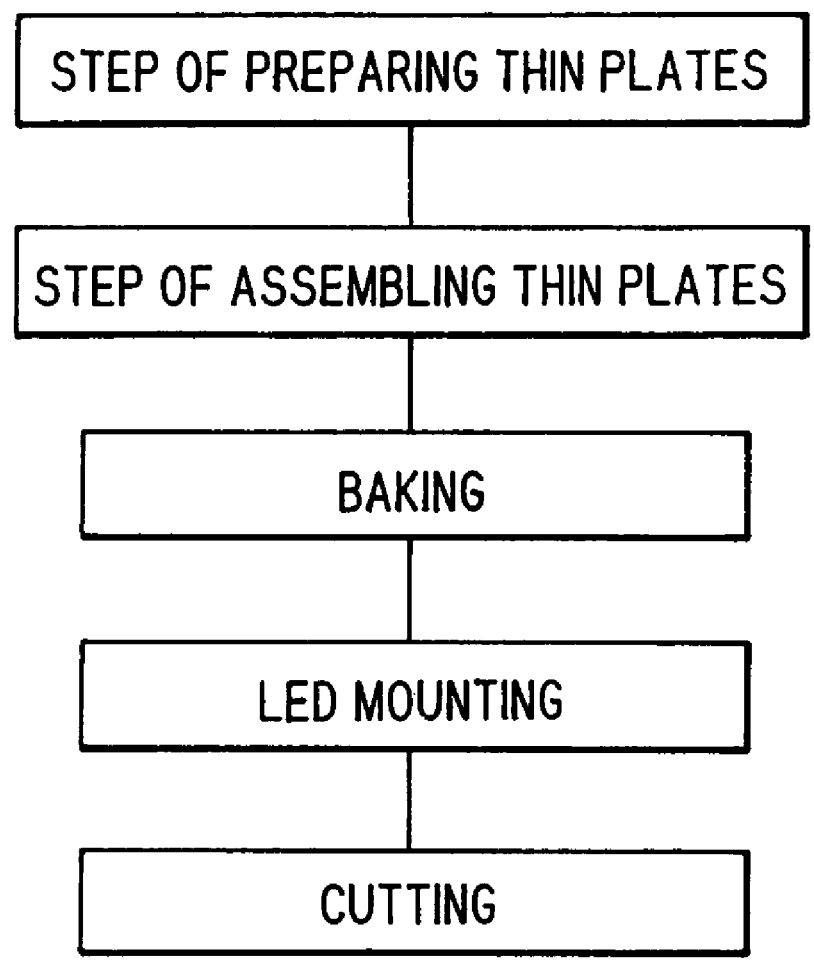
FIG. 12 is a flow chart showing the method of making the LED lamp 101 of the second embodiment.

FIGS. 11A to 11C are perspective views showing a method of making the LED lamp 101 of the second embodiment. FIG. 12 is a flow chart showing the method of making the LED lamp 101 of the second embodiment.

The method of making the LED lamp 101 will be described below with reference to FIGS. 11A to 11C and FIG. 12.

(1) Thin Plates Preparation Step

First, as shown in FIG. 11A, prepared are: thin plates 120, 121 and 122; thin plate 106A with wiring pattern 104 formed thereon; and thin plate 106B with wiring pattern 107.

The thin plates 120, 121 and 122 are provided with a predetermined pattern of elliptic holes formed in separate process to define the opening 102A. The explanation of the separate process is omitted here.

The wiring pattern 107 formation surface of thin plate 106B is provided with a predetermined pattern of rectangular recesses. This recess corresponds to the cutting region 107A to be formed in the wiring pattern 107 formation surface of LED lamp 101 when the LED lamp 101 is cut off in a cutting process described later.

Meanwhile, in FIGS. 11A to 11C, the inverted arc-shaped corner 102a of LED lamp 101 referred to in FIGS. 7 and 8 is not shown.

The thin plate 121 is provided with tungsten film formed on its upper face and exposed face to the opening 102A by known film formation method, after being provided with the opening 102A in separate process.

(2) Thin Plates Assembling Step

Then, as shown in FIG. 11B, the thin plates 120, 121 and 122 are stacked on the thin plates 106A and 106B. At that time, the stacking of thin plates 120, 121 and 122 is conducted by positioning the respective elliptic holes formed on the thin plates 120, 121 and 122. At this step, a plurality of LED lamps are integrally aligned.

(3) Baking Step

Then, such an assembly is subjected to baking treatment to bake the ceramics material and, thereby, the thin plates 120, 121 and 122 can be integrated with the thin plates 106A and 106B.

(4) LED Mounting Step

Then, in the assembly as shown in FIG. 11B, Au layer is formed on the exposed surface of wiring patterns 104 and 107. Then, five LED's are mounted in one opening 102A and part of them is wire-bonded to the wiring pattern 104.

(5) Cutting Step

Then, as shown in FIG. 11C, the assembly is cut off by dicing etc. Thereby, an LED lamp 101 can be obtained.

The effects of the second embodiment are as follows.

(i) Since the cutting region 107A provided in the wiring pattern 107 formation surface is disposed at a position to contact the wiring pattern 109 of external board 108, solder 109a melted in reflowing can rapidly rise along the edge of cutting region 107A. Thus, the solder bonding property can be enhanced.

(ii) Since the cutting region 107A is shaped like a recess to be obtained cutting off the board 106, solder 109a melted is retained within that recess and thereby the rising of solder 109a beyond the cutting region 107A can be prevented. If solder 109a rises so much along the wiring pattern 107, then the entire LED lamp 101 must be unbalanced in weight and it may fall down in such a direction that the wiring pattern 107 formation surface faces the wiring pattern 109. In this embodiment, since solder 109a is unlikely to rise beyond the cutting region 107A, the unbalancing of LED lamp 101 can be prevented.

(iii) With the cutting region 107A formed in the wiring pattern 107, flash becomes unlikely to be generated at the end of wiring pattern 107 when cutting off the LED lamp 101 by dicing etc. As a result, a reduction in wettability or defective product such as pattern separation can be prevented.

(iv) Due to the solder bonding property enhanced by the cutting region 107A, heat generated from LED's 103R1, 103R2, 103G, 103B1 and 103B2 in operation can be efficiently radiated through the solder-bonded portion to the wiring pattern 109 etc. Thus, heat radiation property can be enhanced.

(v) Since the solder bonding is conducted between the wiring patterns 107 and 109 while positioning the mounting surface of LED lamp 101 and the external board 108, the LED lamp 101 can be precisely positioned.

Although, in the second embodiment, transparent epoxy resin is filled as sealing material in the opening 102A, another sealing material may be used. For example, epoxy resin with phosphor mixed therein may be used such that the phosphor is excited by light emitted from LED to generate wavelength-converted light.

Third Embodiment

Figure 13A:
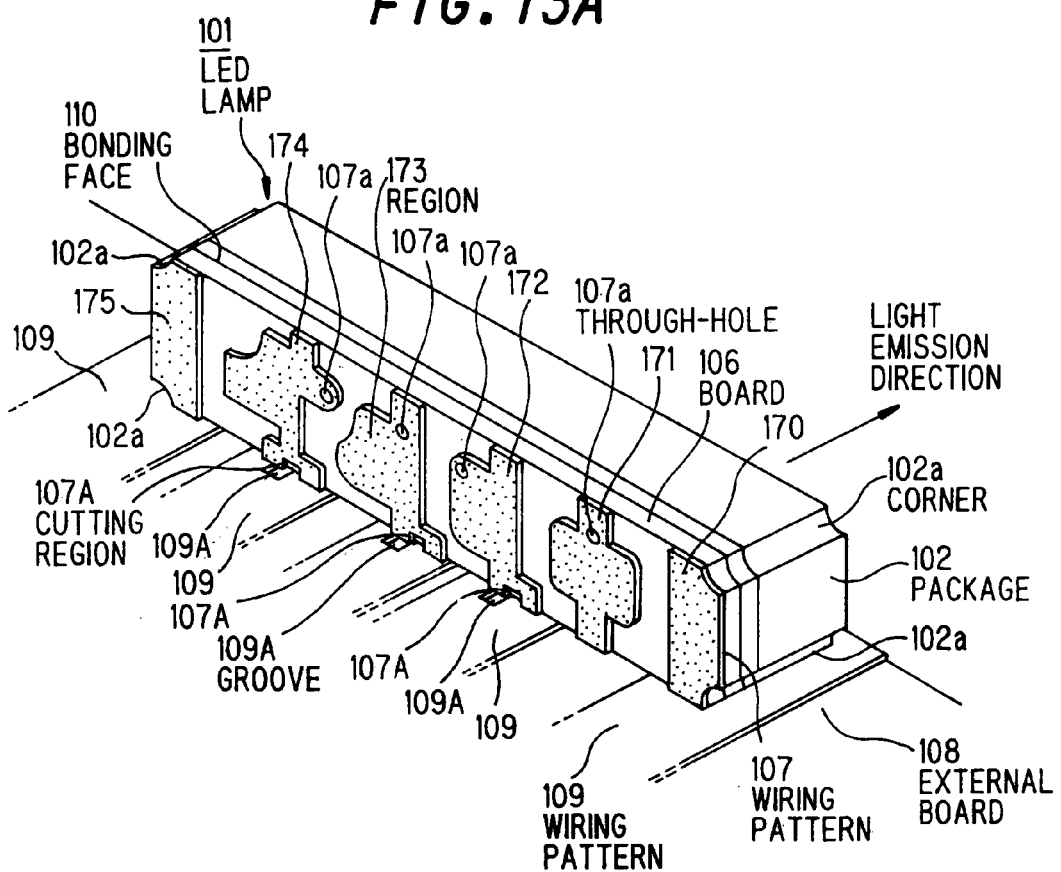
FIG. 13A is a perspective view showing an LED lamp 101 in a third preferred embodiment of the invention
Figure 13B:
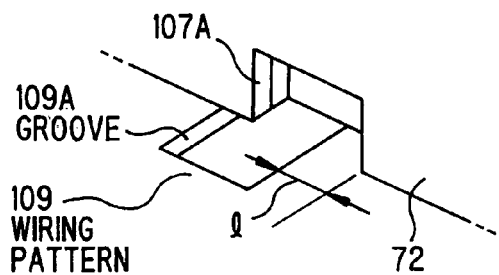
FIG. 13B is an enlarged perspective view showing a cutting region 107A in FIG. 13A.

FIG. 13A is a perspective view showing an LED lamp 101 in the third preferred embodiment of the invention. FIG. 13B is an enlarged perspective view showing a cutting region 107A in FIG. 13A. This perspective view is viewed from the bottom side opposite to the light emission surface of LED lamp 101 mounted on the external board 108. Like components are indicated by the same reference numerals used in the second embodiment.

In the third embodiment, the wiring patter 109 is provided with a groove 109A corresponding to the position of cutting region 107A. As shown in FIG. 13B, the groove 109A is disposed such that it has a deviation 1 to the cutting region 107A. The 109A is obtained by partially removing the wiring pattern 109A and external board 108 by, e.g., etching.

The effects of the third embodiment are as follows.

(i) With the groove 109A provided in the wiring pattern 109 corresponding to the cutting region 107A, the number of edges to promote the flowing of solder increases and the solder bonding property can be enhanced.

(ii) Since solder melted is retained not only in the cutting region 107A but also in the groove 109A, the rising of solder beyond the cutting region 107A can be efficiently prevented while enhancing the solder bonding property.

Although, in the third embodiment, the groove 109A is disposed such that it has a deviation 1 to the cutting region 107A, it may be disposed at the same position as the cutting region 107A.

Fourth Embodiment

Figure 14A:
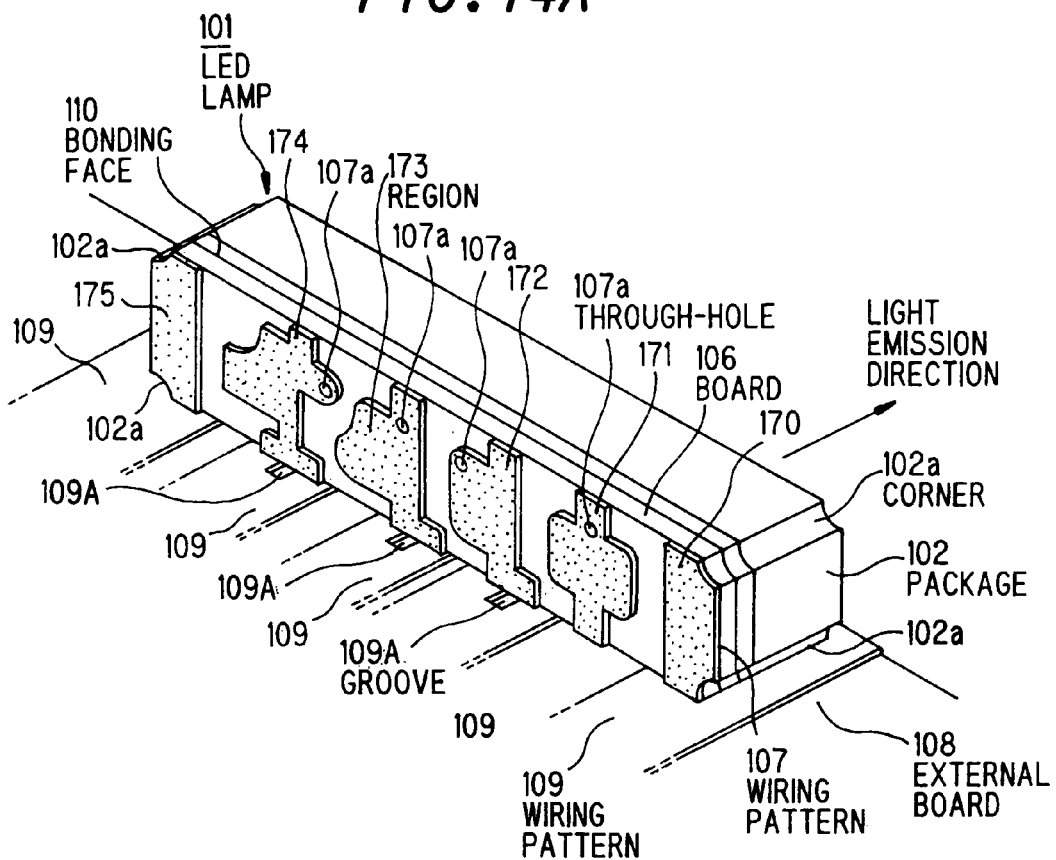
FIG. 14A is a perspective view showing an LED lamp 101 in a fourth preferred embodiment of the invention.
Figure 14B:
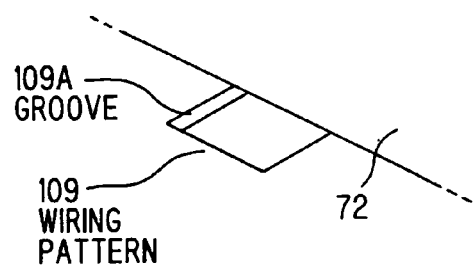
FIG. 14B is an enlarged perspective view showing a groove 109A in FIG. 14A.

FIG. 14A is a perspective view showing an LED lamp 101 in the fourth preferred embodiment of the invention. FIG. 14B is an enlarged perspective view showing a groove 109A in FIG. 14A. This perspective view is viewed from the bottom side opposite to the light emission surface of LED lamp 101 mounted on the external board 108. Like components are indicated by the same reference numerals used in the second embodiment.

In the fourth embodiment, the wiring patter 109 is provided with a groove 109A while providing the wiring pattern 107 with no cutting region 107A. Also in this composition, the rising of solder can be prevented.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting diode (LED) lamp, comprising:
a package; and
a plurality of light emitting elements that are electrically connected to a plurality of electrode plates provided in the package and that are sealed with transparent material, wherein a red light emitting element of the plurality of light emitting elements is wire bonded along a longitudinal direction of the package, a green light emitting element and a blue light emitting element are flip-chip bonded face down directly to a first electrode of the plurality of electrodes, and wherein the plurality of electrodes extend to a surface opposite to a light emission surface of the LED lamp while being embedded in the package.

2. The LED lamp according to claim 1, wherein the red light emitting element comprises a plurality of red light emitting elements, and every two of the plurality of red light emitting elements are connected in series.

3. The LED lamp according to claim 1, wherein the package comprises a ceramics material.

4. The LED lamp of claim 1, wherein said red light emitting element is bonded to said first electrode of the plurality of electrodes.

5. The LED lamp of claim 1, wherein said red light emitting element is wire bonded to a second electrode of said plurality of electrodes.

6. The LED lamp of claim 5, wherein said plurality of light emitting elements further comprises another red light emitting element bonded to a third electrode of said plurality of electrodes and wire bonded to a fourth electrode of said plurality of electrodes.

7. The LED lamp of claim 1, wherein each of the plurality of electrodes extends from said light emitting surface of said package to said surface opposite to said light emitting surface through a through bole extending through said package.

8. The LED lamp of claim 1, wherein said package comprises a board that defines said surface opposite said light emission surface and a surface on which said plurality of electrodes are provided.

9. The LED lamp of claim 8, wherein said board comprises a glass epoxy board.

10. The LED lamp of claim 1, wherein said package comprises a stack of a plurality of thin plate members.

11. The LED lamp of claim 1, wherein said package comprises a stack of three thin plate members.

12. The LED lamp of claim 1, wherein said package defines a plurality of cutting regions at a boundary of the plurality of electrodes on said surface opposite to the light emission surface.

13. The LED lamp of claim 12, wherein each of the plurality of cutting regions corresponds to one of the plurality of electrodes.

14. The LED lamp of claim 12, wherein said at least one of the plurality of cutting regions comprises a rectangular cutting region.

15. The LED lamp of claim 1, wherein said package defines an opening in which said plurality of light emitting elements are received.

16. The LED lamp of claim 15, wherein said plurality of light emitting elements are aligned along a central longitudinal axis of said opening in said package.

17. The LED lamp of claim 1, wherein said package comprises a plating portion at each corner of said package.

18. A light emitting diode (LED) lamp comprising:

a package;

a plurality of electrodes in an opening in said package;

a red light emitting element bonded to a first electrode of said plurality of electrodes;

a green light emitting element directly flip-chip bonded face down to said first electrode; and a blue light emitting element directly flip-chip bonded face down to said first electrode.

* * * * *